United States Patent
Gevorgyan et al.

(10) Patent No.: US 7,548,142 B2
(45) Date of Patent: Jun. 16, 2009

(54) TUNEABLE RESONATOR

(75) Inventors: Spartak Gevorgyan, Gothenburg (SE); Per Thomas Lewin, Onsala (SE); Harald Jacobsson, Vastra Frolunda (SE); Andrei Vorobiev, Gothenburg (SE)

(73) Assignee: Telefonaktiebolagert L M Ericsson (Publ), Stockholm (SE)

( * ) Notice: Subject to any disclaimer, the term of this patent is extended or adjusted under 35 U.S.C. 154(b) by 145 days.

(21) Appl. No.: 11/573,312

(22) PCT Filed: Jul. 6, 2004

(86) PCT No.: PCT/SE2004/001099

§ 371 (c)(1),
(2), (4) Date: Feb. 6, 2007

(87) PCT Pub. No.: WO2006/004470

PCT Pub. Date: Jan. 12, 2006

(65) Prior Publication Data

US 2008/0055023 A1      Mar. 6, 2008

(51) Int. Cl.
*H03B 5/32* (2006.01)
*H03H 3/02* (2006.01)
*H03H 9/17* (2006.01)

(52) U.S. Cl. ............... 333/235; 333/188; 333/191; 310/358

(58) Field of Classification Search .......... 326/188, 326/191, 133, 235; 310/358

See application file for complete search history.

(56) References Cited

U.S. PATENT DOCUMENTS 6,583,688 B2 * 6/2003 Klee et al. ............... 333/188
2003/0071300 A1    4/2003 Yashima

FOREIGN PATENT DOCUMENTS

WO      WO 0178229 A1      10/2001
WO      WO 2006004470 A1 *  1/2006

OTHER PUBLICATIONS

Gevorgian, Spartak; "Do We Really Need Ferroelectrics in Paraelectric Phase Only in Electrically Controlled Microwave Devices?"; IEEE Transactions On Microwave Theory and Techniques, vol. 49, No. 11 Nov. 2001; p. 2117-2124.
Findikoglu, A. T.; "Paraelectric Thin Films for Microwave Application"; Integrated Ferroelectrics, 1997, vol. 15, p. 163-171.
Komlik, VV; "Control of the transmission coefficient at the resonant frequency in a four-terminal network with a paraelectric piezoresonator"; Izvestiya Vysshikh Uchebnykh Zavedenii, Radioelektronika, Sep. 1977, vol. 20, nr-9, p. 84-88 AN 1180698.

* cited by examiner

*Primary Examiner*—Daniel D Chang
(74) *Attorney, Agent, or Firm*—Roger S. Burleigh

(57) ABSTRACT

The invention discloses a tuneable resonator (100, 200, 300, 500, 600, 700, 900) with a substrate layer (140, 260, 360, 560, 660, 960), which substrate layer supports a structure with a first electrode (130, 240, 350, 550, 650). In connection to the first electrode there is arranged a layer (120, 230, 330, 530, 630, 930) of a material which can be brought to resonate. The resonator further comprises a second electrode (110, 210, 310, 510, 610, 710, 910) arranged in connection to said material which can be brought to resonate, and the material which can be brought to resonate is a ferroelectric material. The ferroelectric material is brought into resonance by applying an electrical field (DC, AC) between the first and the second electrode, the tuning being achieved by varying the electrical field.

6 Claims, 10 Drawing Sheets

US 7,548,142 B2

TUNEABLE RESONATOR

TECHNICAL FIELD

The invention relates to a tunable resonator comprising a substrate layer, which substrate layer supports a structure with a first electrode. In connection to the first electrode there is arranged a layer of a material which can be brought to resonate, and the resonator further comprises a second electrode arranged in connection to said material which can be brought to resonate,

BACKGROUND ART

Tuneable resonators are used in many electronics applications, such as, for example, filters and Voltage Controlled Oscillators.

At present, a common kind of tuneable resonator used is the so called LC-resonator, which usually includes a semiconductor varactor. A drawback with LC-resonators is that their Q-factor is usually limited by the losses in their inductor coils.

Another kind of resonator which is also commonly used at present is the so called Thin Film Bulk Acoustic Resonator (TFBAR), which offers substantially higher Q-factors. However, TFBAR:s usually utilize piezoelectric material, which leads to the TFBAR:s not being tuneable, e.g. because the piezoelectric materials do not have DC voltage dependent acoustic parameters.

DISCLOSURE OF THE INVENTION

Thus, as described above, an object of the present invention is to obtain a tuneable resonator with a high Q-factor.

This object is met by the present invention in that it discloses a tuneable resonator which comprises a substrate layer which substrate layer supports a structure with a first electrode, in connection to which first electrode there is arranged a layer of a material which can be brought to resonate. The resonator further comprises a second electrode arranged in connection to the material which can be brought to resonate, and the material which can be brought to resonate is a crystalline ferroelectric material in non-polar (paraelectric) phase.

Suitably, but not necessarily, the crystalline ferroelectric material has (110) or (111) orientation.

The device of the invention can be brought into resonance by applying DC- and AC-fields between the first and the second electrode, the tuning being achieved by varying the AC-field.

Ferroelectric materials in non-polar or paraelectric phase have until now not been considered for use in resonator applications, but can by means of the present invention be brought to resonate, and provide the user with high Q-values.

The present invention also discloses a manufacturing method for a tuneable resonator.

BRIEF DESCRIPTION OF THE DRAWINGS

The invention will be described in more detail below, with reference to the appended drawings, in which.

EMBODIMENTS

Figure 1:
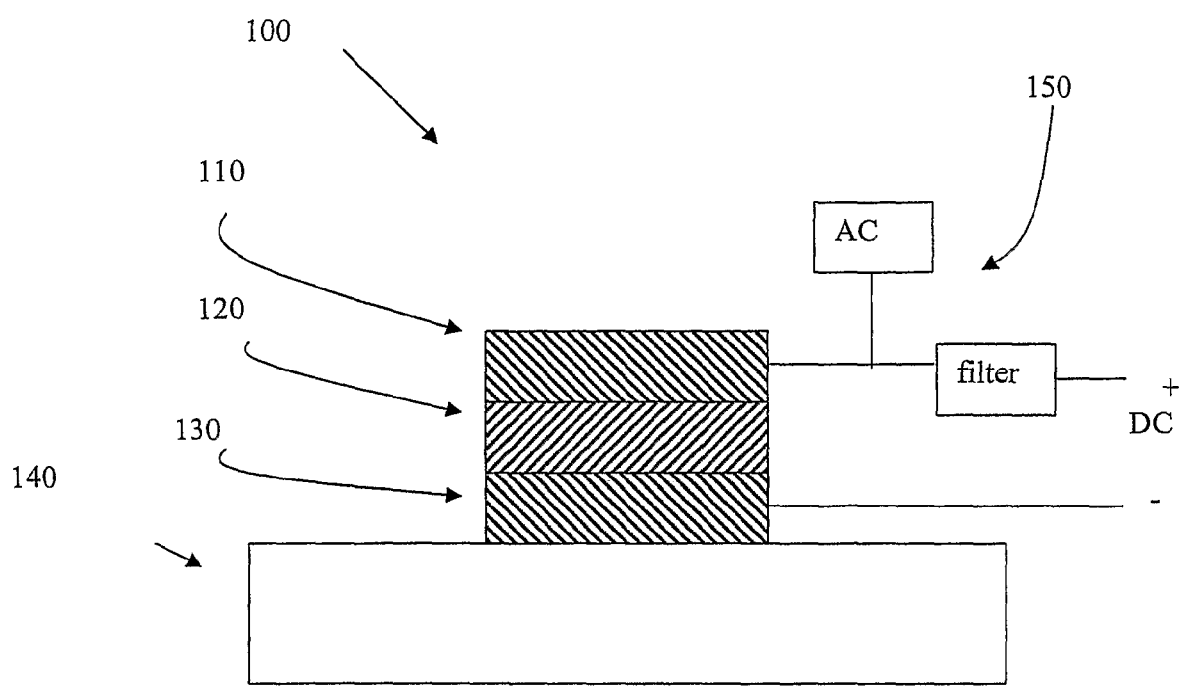
FIG. 1 shows a cross section of a principal device according to the invention.

FIG. 1 shows a cross section of a basic voltage tuneable Thin Film Bulk Acoustic Wave Resonator (TFBAR) resonator 100 according to the present invention. This basic TFBAR 100 comprises a substrate layer 140 made of a non-conducting or high impedance material such as, for example, Si. On top of the substrate layer 140 there is arranged a conducting layer 130 as a first electrode, and on top of this first electrode 130, there is arranged a layer 120 of a material, which can be brought to resonate in a manner shown later in this description.

The resonating material of the layer 120 is, according to the invention, a crystalline ferroelectric material in non-polar phase, also referred to as paraelectric phase. Suitably, but not necessarily, the ferroelectric material has so called (110) or (111) orientation.

The resonating material can be chosen from a wide range of ferroelectric materials, but examples of particularly preferred materials of which mention can be made are $SrT_iO_3$, $Ba_xSr_{1-x}T_iO_3$, $K_xNa_{1-x}NbO_3$, $KTaO_3$, $Ca_xSr_{1-x}TiO_3$ and $K_xLi_{1-x}TaO_3$.

As shown in FIG. 1, there are arranged connections 150 for applying both DC and AC-voltages to the device 100, by means of which the device will be brought to resonate. Details will be given later in this text, but briefly this could be described in the following manner: the applied DC-field will induce a piezoelectric effect in the ferroelectric material, and the AC-field will cause acoustic waves to be generated in the ferroelectric material.

Figure 2A:
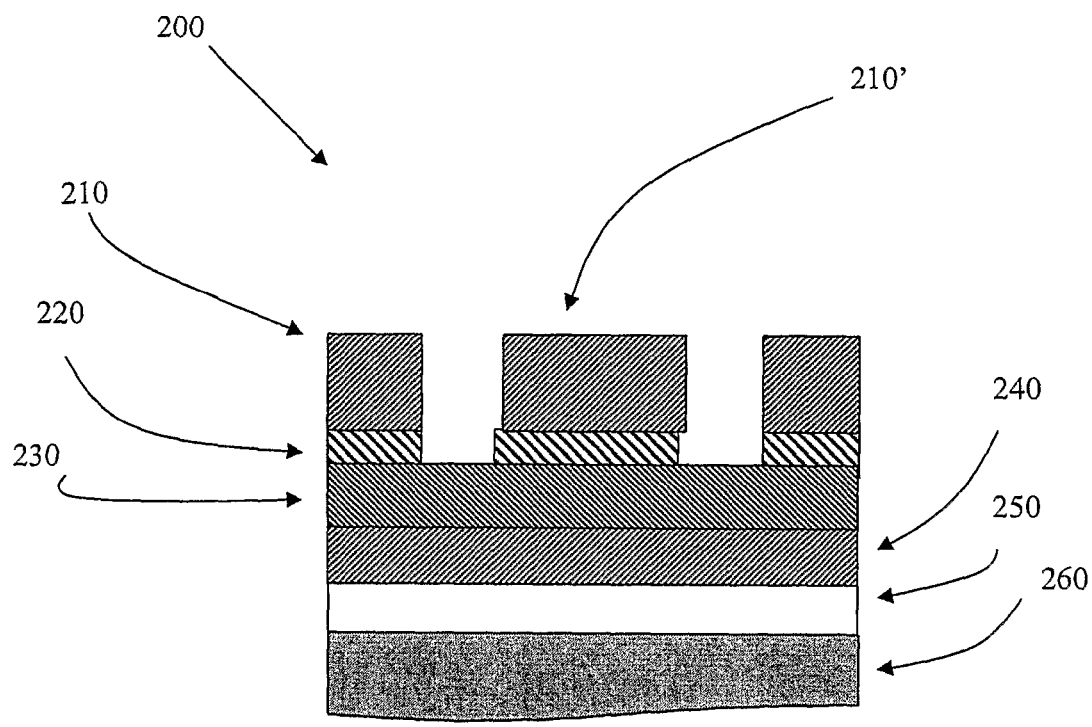
FIG. 2a shows a cross section of a second example of a device according to the invention.

In FIG. 2a, there is shown a more detailed view of an embodiment 200 of the present invention in cross section. The device rests on a non-conducting or high-impedance substrate 260, suitably but not necessarily made of Si. An example of a suitable thickness for this layer is 0.5 mm, although this, as well as other measurements to be given in this text should merely be seen as suitable examples, and not in any way restrictive as to the scope of the invention.

On top of the substrate 260, there may be arranged a layer 250 of a material which is acoustically isolating, such as for example $SiO_2$. A suitable thickness for such a layer is in the area of some micrometers, for example 0.43 μm.

In general, the structure 250 may be a multilayer structure with the thicknesses and acoustic impedances of the layers selected so that at the acoustic resonant frequency of the TFBAR they act as a Bragg reflector A first or bottom electrode 240 is arranged on top of the isolating layer 250, said first electrode being made of a material with good conductivity, such as, for example, Pt, Pt/Au etc. The bottom electrode is suitably a thin layer, preferably but not necessarily with a thickness in the nanometer range, for example 200 nm.

On top of the bottom electrode 240 there is arranged a layer 230 of ferroelectric material. The ferroelectric material should preferably be in paraelectric, i.e. non-polar phase. Examples of suitable materials are stated above and include, for example, $SrTiO_3$, $KTaO_3$, $Ba_xSr_{1-x}TiO_3$ or similar perovksite ferroelectrics above Curie temperature. Details of how the ferroelectric material, and in fact the entire device 100, 200, is manufactured will be given below.

Figure 2B:
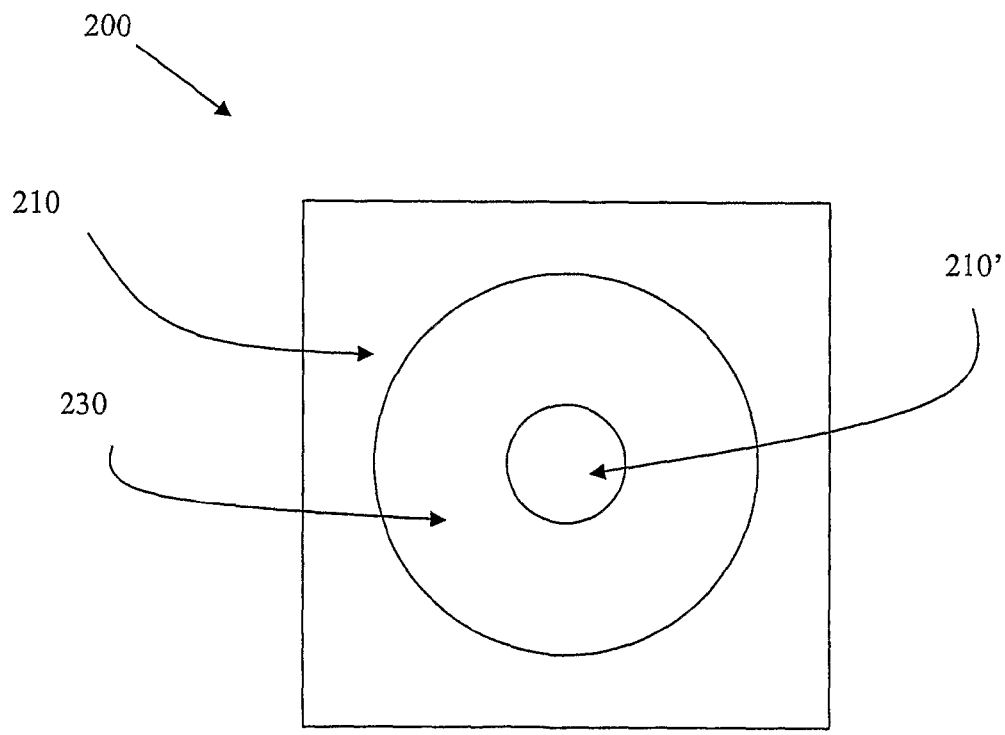
FIG. 2b shows the device of fig a in a top view.

On top of the layer of ferroelectric material, there is arranged a second or top electrode 210, also of a material which has good conducting properties. As can be seen in FIGS. 2a and 2b, the top electrode is divided into two parts, an outer part 210 with an annular opening, and an inner patch 210', with the inner patch preferably being circular.

Figure 3:
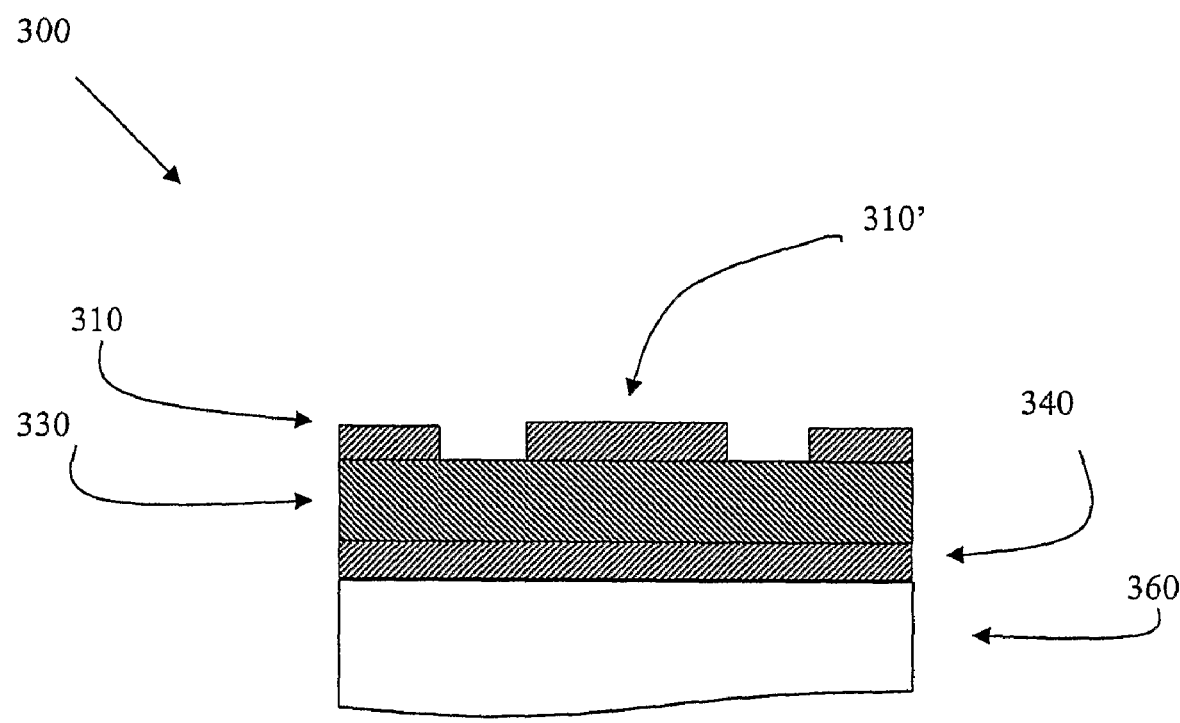
FIG. 3 shows a cross section of another embodiment of the invention.

FIG. 3 shows another version 300 of a TFBAR according to the present invention. The embodiment 300 is basically the same as the embodiment 200 of FIG. 2, but with a few differences: the isolating layer between the bottom electrode 350 and the substrate 360 is not used in the embodiment 300, and the thickness of the top and bottom electrodes 310, 350, is thinner, suitably less than 100 nm.

However, one feature that the embodiment 300 of FIG. 3 has in common with the embodiment 200 is the shape of the top electrode 310: the top electrode has an outer part 310 with an annular opening, inside of which there is a circular patch 310'.

Alternatively, portions of 310 and 330 may be removed to open access to the bottom electrode 350.

Figure 4:
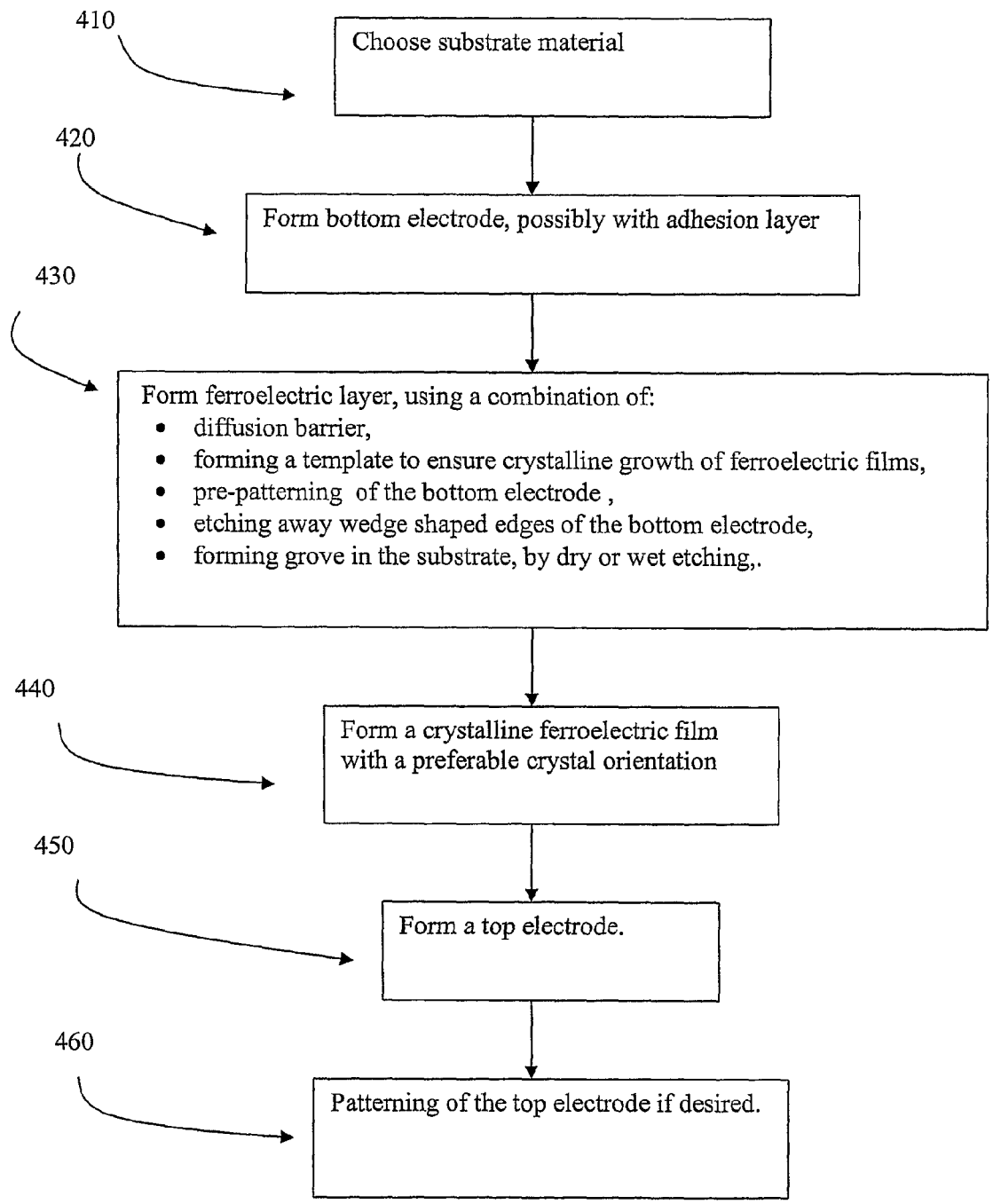
FIG. 4 is a flow chart showing some of the major steps in a production process for a device of the invention.

FIG. 4 is a flow chart showing a suitable method of fabrication of a TFBAR according to the invention. In more detail, the major steps of the fabrication are as follows:

Block 410 of the flow chart: A good quality material is chosen for the substrate layer. Examples of such materials are glass, quartz, semiconductors and oxides. Suitably, the substrate material should have an optical or epitaxial grade polished surface (with a roughness of less than 50 nm, preferably $SiO_2/Si$, to ensure low cost and integration possibility with cost effective silicon technology Block 420 of the flow chart: An adhesion layer with a suitable thickness of approximately up to 200 nm, consisting of a standard adhesion material such as Pt, NiCr, Ti, TiO2 etc., is deposited by a thin film deposition processes such as evaporation, sputtering or laser ablation etc. The preferred deposition temperature is less than 900C.

On top of the adhesion layer, a relatively thin (e.g. <0.1 μm) bottom electrode made of high conductivity metals as Pt, Au, Ag, Cu, etc is formed.

Possibly, as mentioned previously, acoustic isolation can be provided, by etching the substrate or by using a Bragg reflector.

Block 430: A diffusion barrier, suitably a thin film (<200 nm), is created on the bottom electrode in order to prevent diffusion upwards into the layers deposited on top of the barrier, block 430.

On the diffusion barrier, a thin film (e.g. <200 nm) crystalline template is created, block 430, in order to ensure crystalline growth of ferroelectric films (e.g. $SrTiO_3$, $Ba_xSr_{1-x}TiO_3$, $K_xNa_{1-x}NbO_3$, $KTaO_3$, $Ca_xSr_{1-x}TiO_3$, $K_xLi_{1-x}TaO_3$ etc.).

The material for the template is preferably oxide metal, such as $SrRuO_3$ or similar. If the ferroelectric material chosen is from the group of $SrTiO_3$, $Ba_xSr_{1-x}TiO_3$, the template is preferably Pt with orientation (111), but (110) orientation is also possible.

Block 430: One of the next steps is pre-patterning (ion milling, reactive ion milling etc.) of the bottom electrode, including the layers formed on top of it, as described above. This step is optional, depending on the application for which the device is intended.

Also, the etching can be continued in order to etch away wedge shaped edges of the bottom electrode, thus ensuring reduced microwave losses. In addition, a part of the substrate can be removed by, for example, etching to form a groove or other desired shape in the substrate, for example by dry or wet etching, or surface or bulk micromachining.

Block 440: On top of the layers which have been formed up to now, a layer of ferroelectric material is formed, suitably by a growth of crystalline ferroelectric films such as, for example, e.g. $SrTiO_3$, $Ba_xSr_{1-x}TiO_3$, $K_xNa_{1-x}NbO_3$, $KTaO_3$, $Ca_xSr_{1-x}TiO_3$, $K_xLi_{1-x}TaO_3$ etc.

The film of ferroelectric material can be formed in a variety of ways, but is suitably formed by sputtering, laser ablation, MOCVD or similar methods. A preferable option for choice of ferroelectric material is (111) or (110) oriented $SrTiO_3$ or $Ba_xSr_{1-x}TiO_3$.

Block 450: The top electrode is then manufactured by, for example, deposition of a thick (e.g. >200 nm, preferable >0.5 μm) film of a typical electrode material such as Pt, Au, Ag, Cu, Al etc.

If desired, the top electrode can be given a pattern using standard dry or/and wet etching techniques. This process can include spin coating of photoresist layer and opening of windows in the top electrode, block 460.

Figure 5:
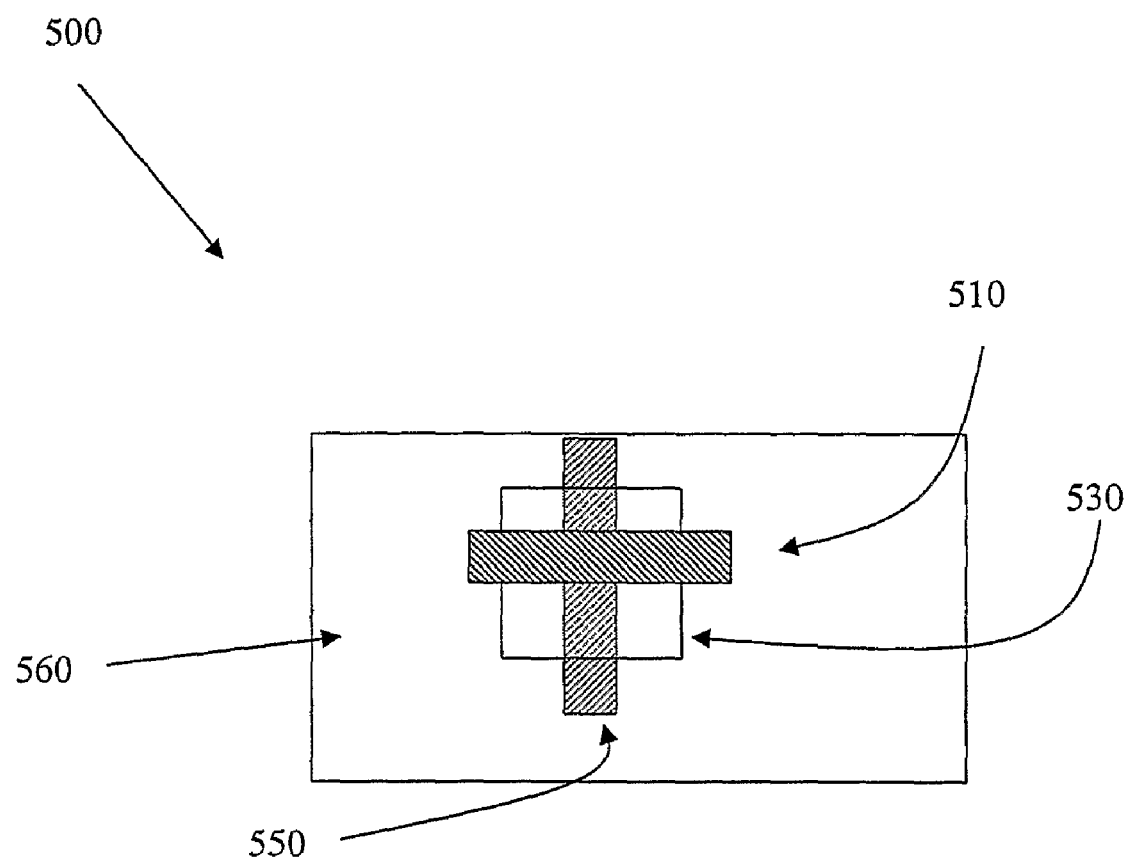
FIGS. 5-7 show top views of different embodiments of the invention.

FIG. 5 shows another embodiment 500 of the present invention: although the embodiment 500 follows the same principles as those embodiments shown previously in this text, this embodiment has top 510 and bottom 550 electrodes that are elongated rectangles, and which in this example of an embodiment have been arranged so that there is an angle greater than zero degrees between the main directions of extension of the two rectangles. In the example shown, the angle is ninety degrees, but other angles can be envisioned within the scope of this invention.

In similarity with the other embodiments shown, the embodiment 500 also includes a substrate layer 560 and a layer 530 of a ferroelectric material.

It can be pointed out here that within the scope of the invention, it would be possible to manufacture two or more TFBAR:s on top of each other, whilst following the principles outlined in this description.

Also, the tunable TFBAR:s of the invention may be arranged in known ways, by providing acoustic and/or electrical coupling between them, to form multipole and two or multi-port tuneable bandpass and stopband filters.

The TFBAR:s may however also be arranged in two and three dimensional arrays to form tuneable frequency selective surfaces, free space two and three dimensional electromagnetic bandgap structures (free space filters).

Figure 6:
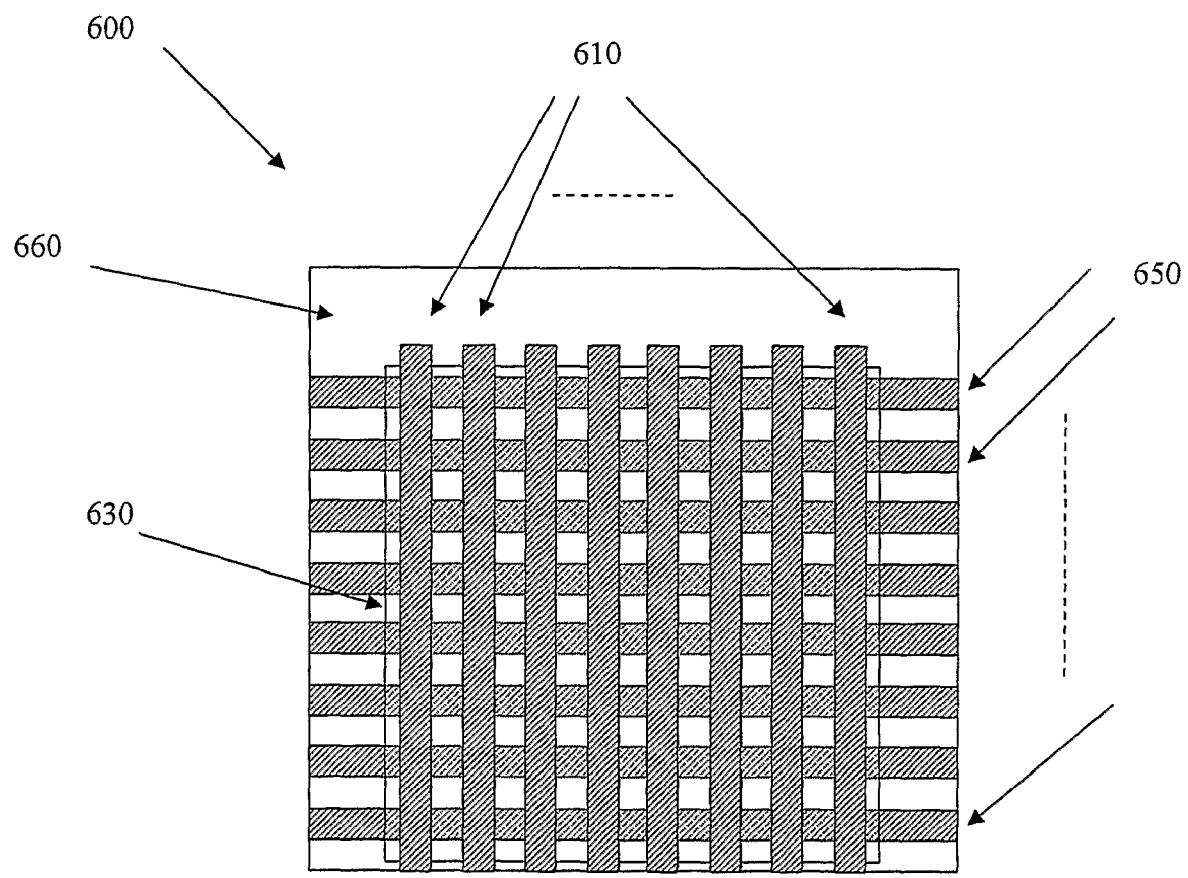

An example of a tuneable 2D TFBAR array is shown in FIG. 6, where each of the TFBARs in the array may have its own electrode and ferroelectric materials: As shown in FIG. 6, the device 600 is a grid or array arrangement, with the top electrodes 610 being in the form of elongated strips, which are arranged in parallel to each other, without mechanical contact between them.

The bottom electrodes 650 are also elongated-strips, arranged in parallel to each other, without mechanical contact between them. However, the top and bottom electrodes are arranged at an angle of ninety degrees between their main directions of extension, so that a grid pattern is formed. The angle may in some applications be less than ninety degrees. As with the previous embodiments, the embodiment 600 includes a substrate layer 660 and a layer 630 of a ferroelectric material.

Figure 7:
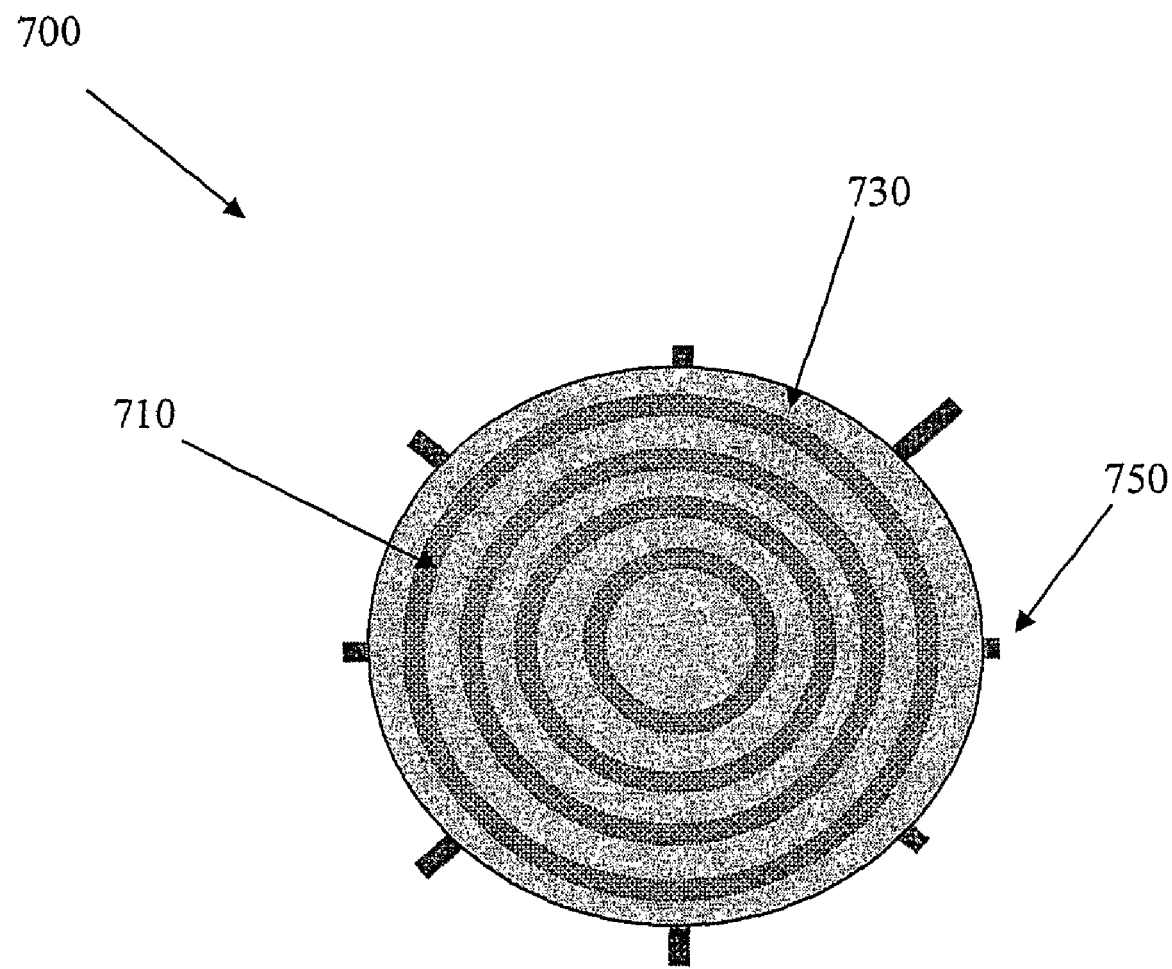

The embodiment 700 shown in FIG. 7 illustrates that TFBAR arrays according to the invention may be in the shape of two dimensional arrays which may, for example, have a circular pattern. In the embodiment 700, the top electrodes 710 are arranged as concentric circles with varying diameters, and the bottom electrodes 750 are arranged as the spokes of a wheel, with the centre of the wheel coinciding with the centre of the circles.

Turning now to the issue of causing the device of the invention to resonate: the inventors have found that by applying both an AC and a DC-field to the electrodes of the device of the present invention, the TFBAR of the invention will resonate at a frequency which is in proportion to said electrical fields, and which also depends on the ferroelectric material chosen, and it's crystalline structure.

With renewed reference to FIG. 1, a basic principle of applying the AC and DC-fields is shown: the top and bottom electrodes 110, 130, are provided with connection means for external signals. Using said connection means, a DC-field is applied between the top and bottom electrodes. A principle behind the present invention is that the applied DC-field causes changes in both the dielectric and acoustic properties of the ferroelectric material, leading to electric field dependencies of the resonant frequency of the TFBAR.

Figure 8:
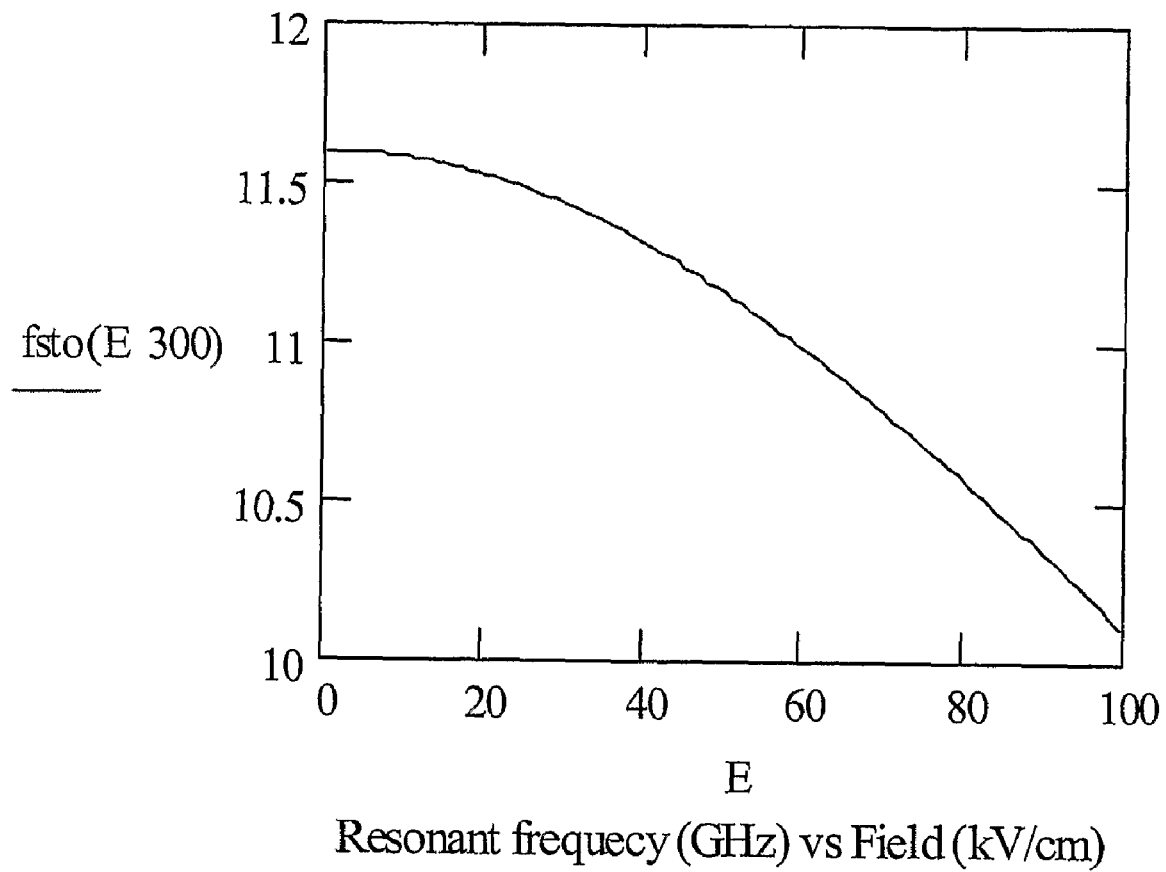
FIG. 8 is a diagram showing the DC-field dependency of a device of the invention.

With reference now to FIG. 8, as an example of the effect of a DC-field on a ferroelectric material, a diagram is shown which shows the dependence of the resonant frequency of the TFBAR based on a 300 nm thick $SrTiO_3$ film under the influence of a DC-field. The x-axis shows the applied DC-field in kV/cm, and the y-axis shows the resonant frequency in GHz.

As mentioned earlier, and as shown in FIG. 1, an AC-field is also applied, simultaneously with the DC-field. The DC-field induces piezoelectricity in the paraelectric (non-polar) phase ferroelectric material which enables the acoustoelectric transformations caused by the AC-field.

The resonance frequency $f_n$ is determined mainly by the choice of material and the strength of the DC-field:

$$f_n = \frac{v_{ac}}{2t} n,$$

where n=1,2,3 ..., t is the thickness of the ferroelectric film, and v is the electric field dependent acoustic velocity. The field dependent resonant frequency is shown in FIG. 8.

Suitably, the AC-field is applied to one of the terminals between which the DC-field is applied, with the use of a filter (as indicated in FIG. 1) to isolate between the AC and DC connections.

A suitable thickness of the ferroelectric film is in the range 10 nm to 2.0 mm, and the range for the strength of the applied DC-voltage is in the area of 50-500 V, with 100 V being a good example of a value which is commonly used. Suitably, the AC-field is in the same order of size as the DC-field.

A reason for the shape of the top electrodes in the embodiments shown in FIGS. 2 and 3 can now be discerned: in some applications, the embodiment shown in FIG. 1 can make it difficult to access the bottom electrode for applying the required AC and DC-fields.

For this reason, the top electrode can be given the shape shown in FIGS. 2 and 3, i.e. a large outer part 210, 310, and a significantly much smaller inner part, 210', 310', for example a patch, with the two parts being electrically separated from each other by, for example, a "gap", as shown in FIGS. 2 and 3. The large outer part 210, 310, of the top electrode will have a significant capacitive coupling to the bottom electrode 250, 350, as compared to the smaller part, 210', 310', which has an essentially non-existent coupling to the bottom electrode due to the size of the patch. This will make it possible to apply the electrical fields between the two parts of the top electrode, with the same result as if the fields had been applied between a top and a bottom electrode.

It should be mentioned here that the shapes of the outer and inner parts of the top electrode shown in FIGS. 2 and 3 are mere examples, the shapes can be chosen more or less arbitrarily, so long as the isolation between the two parts is maintained, as well as the proportions between the two parts. Said proportions should be such that the outer part has good capacitive coupling to the bottom electrode compared to the capacitive coupling of the inner part and the bottom electrode. Naturally the proportions can be reversed, so that the inner part is larger than the outer part, or two top "islands" can be envisioned, where one is large and the other is small.

Figure 9:
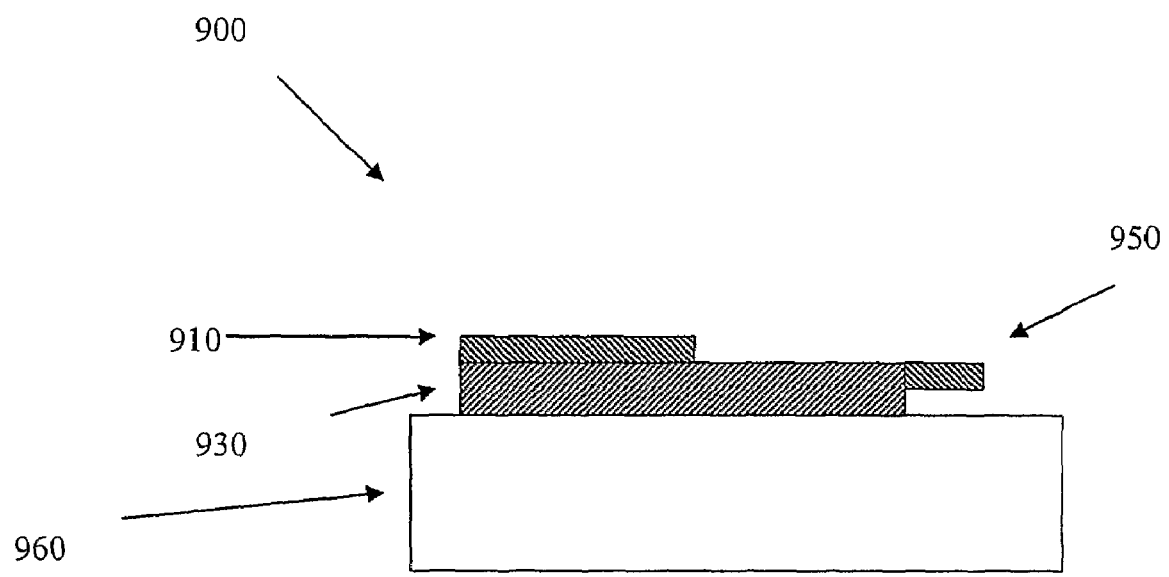
FIG. 9 is a cross section of a different embodiment of the invention.

FIG. 9 shows another embodiment 900, which illustrates that the principle of top and bottom electrodes according to the invention can in fact be expanded into the principle of a first and a second electrode. This is shown in FIG. 9, in that the device shown there comprises a substrate 960 and a layer of a ferroelectric material 930 arranged directly on said substrate, possibly with some isolation as outlined previously in this text.

In conjunction with the ferroelectric layer 930 there are arranged two electrodes 910 and 950, with one of the electrodes 910 being arranged on top of the ferroelectric material 930, and the other electrode 950 being arranged on the side of the ferroelectric material. Obviously, many embodiments of this principle can be envisioned within the scope of the present invention.

Turning now to the theoretical aspects of the invention, the following observations can be made:

A material such as for example $SrTiO_3$ has a considerable electrostrictive effect at relatively low electric fields. Additionally, under strong electric field the center symmetric crystal becomes piezoelectric, with field dependent acoustic constants (acoustic velocity, elastic compliance, piezoelectric coefficient etc.).

Under external electric field, the electrostrictive effect (inherent to all materials, but weak in most of them) works together with the electric field induced piezoelectric effect, resulting in a field dependent effective piezoelectric coefficient as follows:

$$d^*_{33} = d_{33} + g_{33}E_3 \tag{6}$$

where $d_{33}$ is the field independent piezoelectric coefficient, and $g_{33}$ is the electrostrictive coefficient. Due to the field dependent piezoelectric coefficient $d^*_{33}$, the electromechanical coupling coefficient also becomes electric field dependent, expressed as:

$$K^2 = \frac{k_{33}^2}{1 + k_{33}^2} \tag{7}$$

where $$k_{33}^2 \approx \frac{(d^*_{33})^2 s_{33}}{\varepsilon_o \varepsilon_{33}} \tag{8}$$

where $\varepsilon_{33}$ is the electric field dependent dielectric permittivity of the ferroelectric film in the direction normal to the plates of the resonator, and $\varepsilon_o = 8.85 \cdot 10^{-12}$ F/m is the dielectric constant of the free space.

Not only the piezoelectric, electrostrictive coefficients and dielectric permittivity, but also the elastic compliance $s_{33}$ are electric field dependent. The latter may be approximated as $$s_{33}=2.3*10^{-13[1-1.11410*E^2]} \quad (9)$$

The field dependence of $s_{33}$ results in field dependent acoustic velocity:

$$v_{ac}=1/(\rho s_{33})^{1/2} \quad (10)$$

and the resonant frequency of the resonator:

$$f_n = \frac{v_{ac}}{2t}n = \frac{n}{2t}\sqrt{\frac{1}{\rho s_{33}}}, n = 1, 2 \ldots \quad (11)$$

where t is the thickness of the film, and $\rho$ is the materials density.

Figure 10:
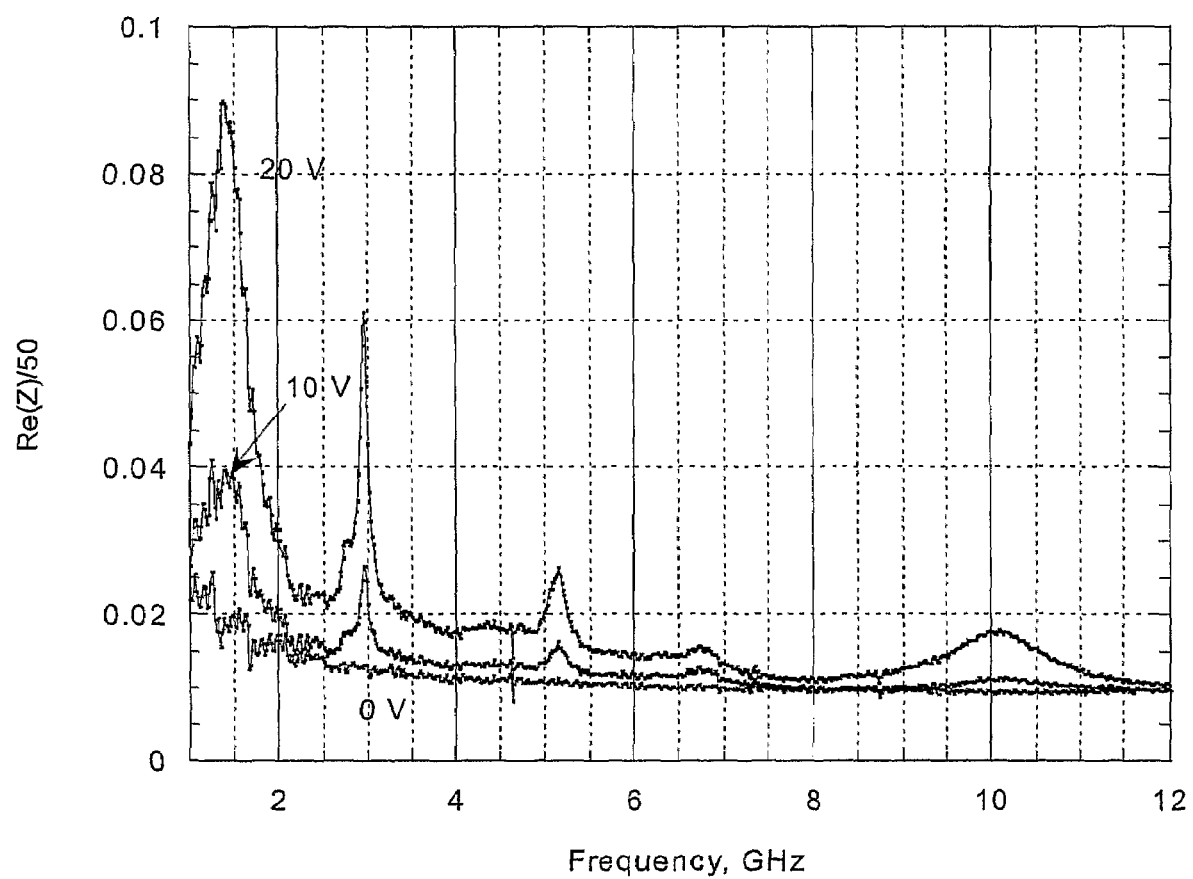
FIG. 10 shows different resonance frequencies in a device according to the invention.

FIG. 10 illustrates the fact that a device according top the invention can be made to resonate at different "resonance peaks", each peak corresponding to an integer value of the variable n in equation [11]. As can be seen, different curves will be followed by the resonance function depending on the DC voltage applied to the device in the manner described earlier in this text. The DC-voltages for the different curves in FIG. 10, in order of magnitude, are 20, 10, and 0 Volts respectively.

The AC-voltage which is also applied as described in this text is in the range of 5 Volts. Appropriate magnitudes for the voltages, both AC and DC, can and should also be determined, for example by the use of experiments, for each combination of materials and material thickness for each specific application.

The invention claimed is:

1. A tuneable resonator, comprising:
a substrate layer, said substrate layer supporting a structure with a first electrode, in connection to which first electrode there is arranged a layer of a material which can be brought to resonate, said resonator further comprising a second electrode arranged in connection to said material which can be brought to resonate, wherein said material which can be brought to resonate is a crystalline ferroelectric material in non-polar (paraelectric) phase;
wherein said ferroelectric material is brought into resonance by applying a DC-field between the first and the second electrode in order to induce piezoelectric effect in the resonant material, and by applying an AC-field between the same electrodes in order to generate acoustic waves in said material.

2. The tuneable resonator of claim 1, wherein the first and second electrodes and the resonant material are arranged in a sandwich structure, wherein the first electrode is arranged closest to the substrate and the layer of the resonant material is arranged on top of the first electrode, and wherein the second electrode is arranged on top of the resonating material.

3. The tuneable resonator of claim 1, wherein the material which can be brought into resonance comprises one or several materials selected from the group consisting of: $SrTiO_3$, $Ba_xSr_{1-x}TiO_3$, $K_xNa_{1-x}NbO_3$, $KTaO_3$, $Ca_xSr_{1-x}TiO_3$, $K_xLi_{1-x}TaO_3$.

4. The tuneable resonator, comprising:
a substrate layer, said substrate aver supporting a structure with a first electrode, in connection to which first electrode there is arranged a layer of a material which can be brought to resonate, said resonator further comprising a second electrode arranged in connection to said material which can be brought to resonate, wherein said material which can be brought to resonate is a crystalline ferroelectric material in non-polar (paraelectric) phase;
wherein the first and the second electrodes have an essentially rectangular form and are arranged so that there is an angle greater than zero degrees between the main directions of extension of the two rectangles.

5. A method for manufacturing a tuneable resonator, comprising the steps of:
producing, on top of a non-conducting substrate, a first electrode;
producing, on top of said first electrode, a layer of a material which can be brought to resonate;
producing, on top of said ferroelectric layer, a second electrode;
wherein said material which can be brought to resonate is a crystalline ferroelectric material in non-polar (paraelectric) phase;
wherein the first and the second electrodes have an essentially rectangular form and are arranged so that there is an angle greater than zero degrees between the main directions of extension of the two rectangles.

6. The method of claim 5, wherein the material for the ferroelectric layer is chosen from the group consisting of: $SrTiO_3$, $KTaO_3$, $BA_xSr_{1-x}TiO_3$.

* * * * *

UNITED STATES PATENT AND TRADEMARK OFFICE
CERTIFICATE OF CORRECTION

PATENT NO. : 7,548,142 B2
APPLICATION NO. : 11/573312
DATED : June 16, 2009
INVENTOR(S) : Gevorgian et al.

It is certified that error appears in the above-identified patent and that said Letters Patent is hereby corrected as shown below:

On the Title Page, item (12), in Column 1, Line 2, delete "Gevorgyan" and insert -- Gevorgian --, therefor.

On the Title Page, item (75), under "Inventors", in Column 1, Line 1, delete "Spartak Gevorgyan," and insert -- Spartak Gevorgian, --, therefor.

On the Title Page, item (75), under "Inventors", in Column 1, Line 2, delete "Per Thomas Lewin," and insert -- Thomas Lewin, --, therefor.

On the Title Page, item (73), under "Assignee", in Column 1, Line 1, delete "Telefonaktiebolagert" and insert -- Telefonaktiebolaget --, therefor.

In Column 1, Line 11, delete "resonate," and insert -- resonate. --, therefor.

In Column 2, Lines 33-34, delete "SrT$_i$O$_3$, Ba$_x$Sr$_{1-x}$T$_i$O$_3$," and insert -- SrTiO$_3$, Ba$_x$Sr$_{1-x}$TiO$_3$, --, therefor.

In Column 3, Line 39, delete "TiO2" and insert -- TiO$_2$ --, therefor.

In Column 6, Lines 56-57, in Equation (7), delete " $K^2 = \frac{k_{33}^2}{1 + k_{33}^2}$ " and insert -- $K^2 = \frac{k_{33}^2}{1 + k_{33}^2}$ --, therefor.

In Column 8, Line 16, in Claim 4, delete "aver" and insert -- layer --, therefor.

UNITED STATES PATENT AND TRADEMARK OFFICE
CERTIFICATE OF CORRECTION

PATENT NO.         : 7,548,142 B2
APPLICATION NO.   : 11/573312
DATED              : June 16, 2009
INVENTOR(S)        : Gevorgian et al.

It is certified that error appears in the above-identified patent and that said Letters Patent is hereby corrected as shown below:

In Column 8, Line 45, in Claim 6, delete "$BA_xSr_{1-x}TiO_3.$" and insert -- $Ba_xSr_{1-x}TiO_3.$ --, therefor.

Signed and Sealed this

Seventeenth Day of November, 2009

David J. Kappos
*Director of the United States Patent and Trademark Office*